US011646295B2

(12) United States Patent
Chang et al.

(10) Patent No.: US 11,646,295 B2
(45) Date of Patent: *May 9, 2023

(54) SEMICONDUCTOR PACKAGE STRUCTURE HAVING AN ANNULAR FRAME WITH TRUNCATED CORNERS

(71) Applicant: MEDIATEK INC., Hsinchu (TW)

(72) Inventors: Chia-Cheng Chang, Hsinchu (TW); Tzu-Hung Lin, Hsinchu (TW); I-Hsuan Peng, Hsinchu (TW); Yi-Jou Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/488,921

(22) Filed: Sep. 29, 2021

(65) Prior Publication Data

US 2022/0020726 A1    Jan. 20, 2022

Related U.S. Application Data

(63) Continuation of application No. 16/563,919, filed on Sep. 8, 2019, now Pat. No. 11,171,113, which is a
(Continued)

(51) Int. Cl.
*H01L 25/065* (2006.01)
*H01L 23/538* (2006.01)
(Continued)

(52) U.S. Cl.
CPC ...... *H01L 25/0655* (2013.01); *H01L 23/3128* (2013.01); *H01L 23/49816* (2013.01);
(Continued)

(58) Field of Classification Search
CPC .......... H01L 23/3128; H01L 23/49816; H01L 23/5386; H01L 23/49811; H01L 23/5383;
(Continued)

(56) References Cited

U.S. PATENT DOCUMENTS 5,841,194 A    11/1998  Tsukamoto
6,020,221 A    2/2000   Lim et al.
(Continued)

FOREIGN PATENT DOCUMENTS

CN        1163480 A     10/1997
CN      102110660 A      6/2011
(Continued)

OTHER PUBLICATIONS

European Search Report dated May 6, 2020, issued in application No. EP 19213567.1.
(Continued)

*Primary Examiner* — Jasmine J Clark
(74) *Attorney, Agent, or Firm* — McClure, Qualey & Rodack, LLP

(57) ABSTRACT

A semiconductor package structure includes a substrate having a substrate having a first surface and second surface opposite thereto, wherein the substrate comprises a wiring structure. The structure also has a first semiconductor die disposed on the first surface of the substrate and electrically coupled to the wiring structure, and a second semiconductor die disposed on the first surface and electrically coupled to the wiring structure, wherein the first semiconductor die and the second semiconductor die are arranged in a side-by-side manner. A molding material surrounds the first semiconductor die and the second semiconductor die, wherein the first semiconductor die is separated from the second semiconductor die by the molding material. Finally, an annular frame mounted on the first surface of the substrate, wherein the annular frame surrounds the first semiconductor die and the second semiconductor die.

18 Claims, 7 Drawing Sheets

Related U.S. Application Data continuation-in-part of application No. 15/906,098, filed on Feb. 27, 2018, now Pat. No. 10,784,211.

(60) Provisional application No. 62/729,541, filed on Sep. 11, 2018, provisional application No. 62/470,915, filed on Mar. 14, 2017.

(51) Int. Cl.
*H01L 23/31* (2006.01)
*H01L 23/498* (2006.01)
*H01L 23/00* (2006.01)
*H01L 23/367* (2006.01)

(52) U.S. Cl.
CPC ...... *H01L 23/5386* (2013.01); *H01L 23/3675* (2013.01); *H01L 24/16* (2013.01); *H01L 2224/16113* (2013.01); *H01L 2224/16227* (2013.01); *H01L 2924/3511* (2013.01)

(58) Field of Classification Search
CPC . H01L 23/5384; H01L 23/13; H01L 23/3677; H01L 24/32; H01L 23/73; H01L 25/0655
See application file for complete search history.

(56) References Cited

U.S. PATENT DOCUMENTS

| | | | |
|---|---|---|---|
| 6,313,521 B1 | 11/2001 | Baba | |
| 8,247,900 B2 | 8/2012 | Yuan | |
| 8,710,629 B2 | 4/2014 | Bai et al. | |
| 9,209,048 B2 | 12/2015 | Huang et al. | |
| 9,412,662 B2 | 8/2016 | Lin et al. | |
| 9,425,171 B1 | 8/2016 | Minacapelli et al. | |
| 9,543,249 B1 | 1/2017 | Hu | |
| 10,529,645 B2 | 1/2020 | Gandhi et al. | |
| 11,171,113 B2 * | 11/2021 | Chang | H01L 23/5383 |
| 2001/0017408 A1 | 8/2001 | Baba | |
| 2002/0011907 A1 | 1/2002 | Yamada et al. | |
| 2004/0150118 A1 | 8/2004 | Honda | |
| 2005/0186769 A1 | 8/2005 | Young | |
| 2007/0001278 A1 | 1/2007 | Jeon et al. | |
| 2007/0069366 A1 | 3/2007 | Chang et al. | |
| 2007/0194464 A1 | 8/2007 | Fukuzono | |
| 2008/0054490 A1 | 3/2008 | McLellan et al. | |
| 2008/0179725 A1 | 7/2008 | Chia et al. | |
| 2008/0237840 A1 | 10/2008 | Alcoe et al. | |
| 2008/0258293 A1 | 10/2008 | Yang et al. | |
| 2009/0236730 A1 | 9/2009 | Topacio et al. | |
| 2010/0276799 A1 | 11/2010 | Heng et al. | |
| 2011/0156235 A1 | 6/2011 | Yuan | |
| 2012/0018871 A1 | 1/2012 | Lee et al. | |
| 2012/0182694 A1 | 7/2012 | Lin et al. | |
| 2012/0188721 A1 | 7/2012 | Ho et al. | |
| 2013/0234304 A1 | 9/2013 | Tamaki | |
| 2014/0070423 A1 | 3/2014 | Woychik et al. | |
| 2015/0187737 A1 | 7/2015 | Lin et al. | |
| 2016/0351467 A1 | 12/2016 | Li | |
| 2017/0018510 A1 | 1/2017 | Shen et al. | |
| 2018/0138127 A1 | 5/2018 | Lee et al. | |
| 2018/0175001 A1 | 6/2018 | Pyo et al. | |
| 2018/0204807 A1 | 7/2018 | Aizawa | |
| 2018/0269164 A1 | 9/2018 | Lin et al. | |
| 2018/0350772 A1 | 12/2018 | Nair et al. | |
| 2018/0374820 A1 | 12/2018 | Ko et al. | |
| 2019/0115269 A1 | 4/2019 | Pan et al. | |

FOREIGN PATENT DOCUMENTS

| | | |
|---|---|---|
| CN | 201936868 U | 8/2011 |
| CN | 103038877 A | 4/2013 |
| CN | 103066029 A | 4/2013 |
| CN | 203659838 U | 6/2014 |
| CN | 111696979 A | 9/2020 |
| DE | 198 30 158 A1 | 4/1999 |
| DE | 10 2013 200 518 A1 | 7/2013 |
| EP | 0 797 253 A2 | 9/1997 |
| EP | 2 066 160 A2 | 6/2009 |
| EP | 3 376 535 A1 | 9/2018 |
| JP | 2003-017625 A | 1/2003 |
| JP | 2004-247464 A | 9/2004 |
| KR | 10-2008-0093909 A | 10/2008 |
| TW | 201546954 A | 12/2015 |
| TW | 201608653 A | 3/2016 |
| TW | 201705414 A | 2/2017 |
| TW | M563659 U | 7/2018 |
| TW | 201834164 A | 9/2018 |
| TW | M572570 U | 1/2019 |
| WO | 2013/119309 A1 | 8/2013 |

OTHER PUBLICATIONS

Chinese language office action dated May 7, 2020, issued in application No. CN 201810189557.2.
European Search Report dated May 27, 2020, issued in application No. EP 20162559.7.
Chinese language office action dated Jun. 19, 2020, issued in application TW 109108155.
European Search Report dated Nov. 13, 2020, issued in application No. EP 20178978.1.
Chinese language office action dated Jan. 13, 2021, issued in application No. TW 109120165.
Chinese language office action dated Mar. 31, 2021, issued in application No. TW 108145283.
Chinese language office action dated Jun. 2, 2021, issued in application No. CN 201911261556.5.
Chinese language office action dated Sep. 14, 2021, issued in application No. TW 108145283.
Chinese language office action dated Dec. 12, 2022, issued in application No. CN 202010518839.X.
English language office action dated Mar. 16, 2023, issued in U.S. Appl. No. 17/575,789.

* cited by examiner

SEMICONDUCTOR PACKAGE STRUCTURE HAVING AN ANNULAR FRAME WITH TRUNCATED CORNERS

CROSS REFERENCE TO RELATED APPLICATION

This application is a continuation of U.S. application Ser. No. 16/563,919, filed Sep. 8, 2019, now U.S. Pat. No. 11,171,113, which is a continuation-in-part of U.S. application Ser. No. 15/906,098 filed Feb. 27, 2018 (now U.S. Pat. No. 10,784,211, issued on Sep. 22, 2020), which itself claims the priority from U.S. provisional application No. 62/470,915 filed Mar. 14, 2017. Applicant Ser. No. 16/563,919 also claims priority from U.S. provisional application No. 62/729,541 filed Sep. 11, 2018. All of the above-mentioned applications are included in their entirety herein by reference.

BACKGROUND

The present invention relates to a semiconductor package structure, and more particularly, to a semiconductor package structure with an annular frame disposed on a top surface of a package substrate therein.

A semiconductor package can not only provide a semiconductor die with protection from environmental contaminants, but it can also provide an electrical connection between the semiconductor die packaged therein and a substrate, such as a printed circuit board (PCB). For instance, a semiconductor die may be enclosed in an encapsulating material, and traces are electrically connected to the semiconductor die and the substrate.

However, a problem with such a semiconductor package is that it is subject to different temperatures during the packaging process. The semiconductor package may be highly stressed due to the different coefficients of thermal expansion (CTEs) of the various substrate and semiconductor die materials. As a result, the semiconductor package may exhibit warping or cracking so that the electrical connection between the semiconductor die and the substrate may be damaged, and the reliability of the semiconductor package may be decreased.

This problem is exacerbated in the case of a relatively large package, for example a package of 50 mm×50 mm or larger. Therefore, a novel semiconductor package structure is desirable.

SUMMARY

It is one object of the present disclosure to provide an improved semiconductor package structure with an annular frame in order to solve the above-mentioned prior art shortcomings or problems.

According to one aspect of the present disclosure, a semiconductor package structure includes a substrate having a first surface and second surface opposite thereto, a first semiconductor die disposed on the first surface of the substrate, a second semiconductor die disposed on the first surface, a molding material surrounding the first semiconductor die and the second semiconductor die, and an annular frame mounted on the first surface of the substrate. The first semiconductor die and the second semiconductor die are arranged in a side-by-side manner. The first semiconductor die is separated from the second semiconductor die by the molding material. The substrate comprises a wiring structure. The first semiconductor die and the second semiconductor die are electrically coupled to the wiring structure. The annular frame surrounds the first semiconductor die and the second semiconductor die. The annular frame comprises a retracted region at an outer corner of the annular frame.

According to some embodiments, the annular frame has a substantially rectangular shape when viewed from above.

According to some embodiments, a portion of the frame within the retracted region is truncated from the annular frame, thereby form a bevel angle at the outer corner of the annular frame.

According to some embodiments, the semiconductor package structure further comprises bump structures disposed on the second surface of the substrate.

According to some embodiments, the bump structures are a land grid array (LGA).

According to some embodiments, a securing means is provided on the annular frame to secure the substrate to a base.

According to some embodiments, the base comprises a PCB or a system board.

According to some embodiments, the securing means comprises a socket.

According to some embodiments, the semiconductor package structure further comprises an adhesive layer between the annular frame and the first surface of the substrate.

According to some embodiments, the adhesive layer is not covered by the annular frame within the retracted region.

According to some embodiments, the annular frame has a width w, and wherein w ranges between 3 mm and 18 mm.

According to some embodiments, the retracted region has a right-triangle shape.

According to some embodiments, an area of the right-triangle shaped retracted regions is presented by $d^2/2$, wherein d is the length of the sides of legs of the right-triangle shaped retracted regions, and wherein d is greater than or equal to w/2.

According to some embodiments, the semiconductor package structure according to claim 1 further comprising an extension portion that inwardly extends at an inner corner of the annular frame.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention can be more fully understood by reading the subsequent detailed description and examples with references made to the accompanying drawings, wherein:

FIG. 1 is a cross-sectional view of the semiconductor package structure along line I-I' of FIG. 2;

DETAILED DESCRIPTION

Figure 1:
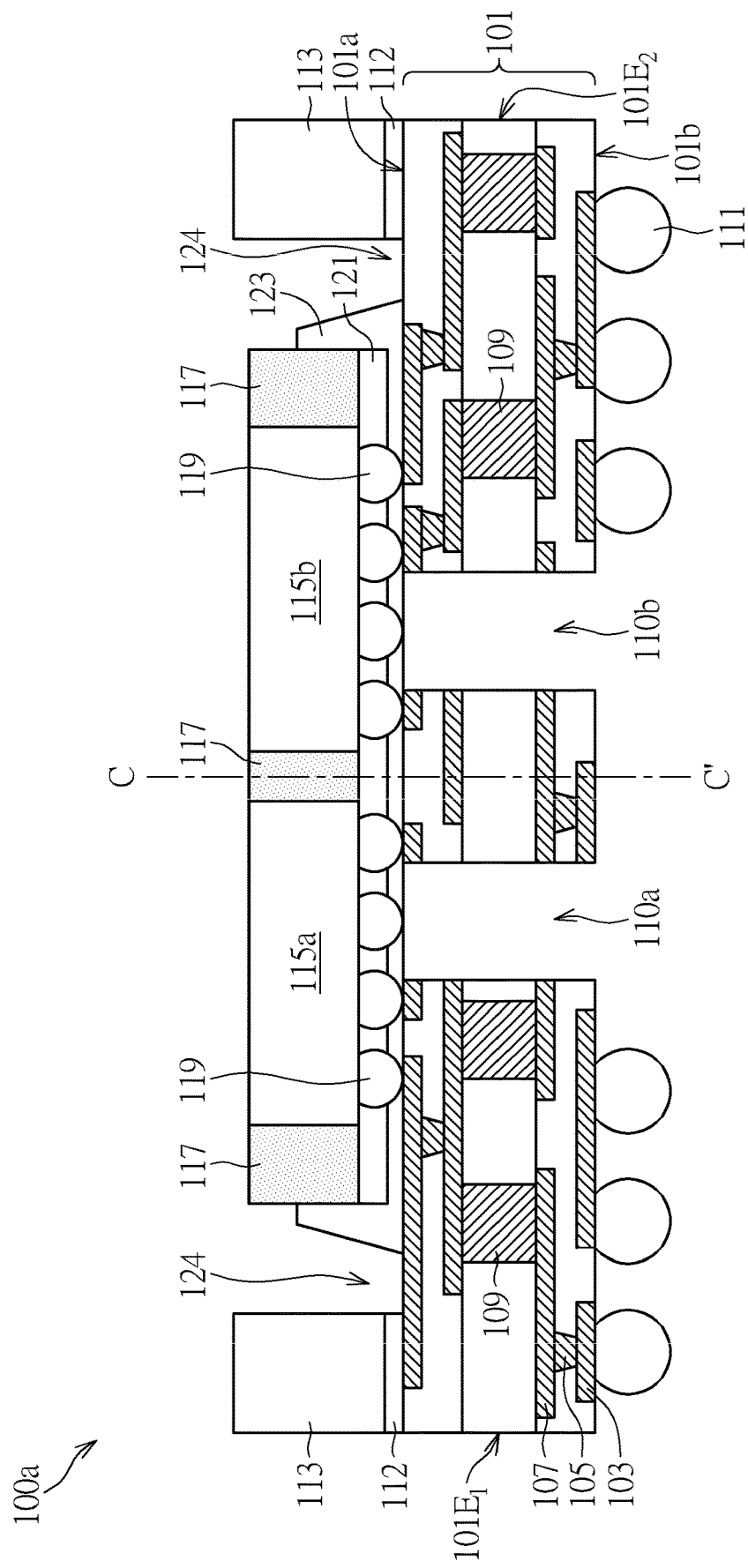
FIG. 1 is a cross-sectional view of a semiconductor package structure according to one embodiment of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 2:
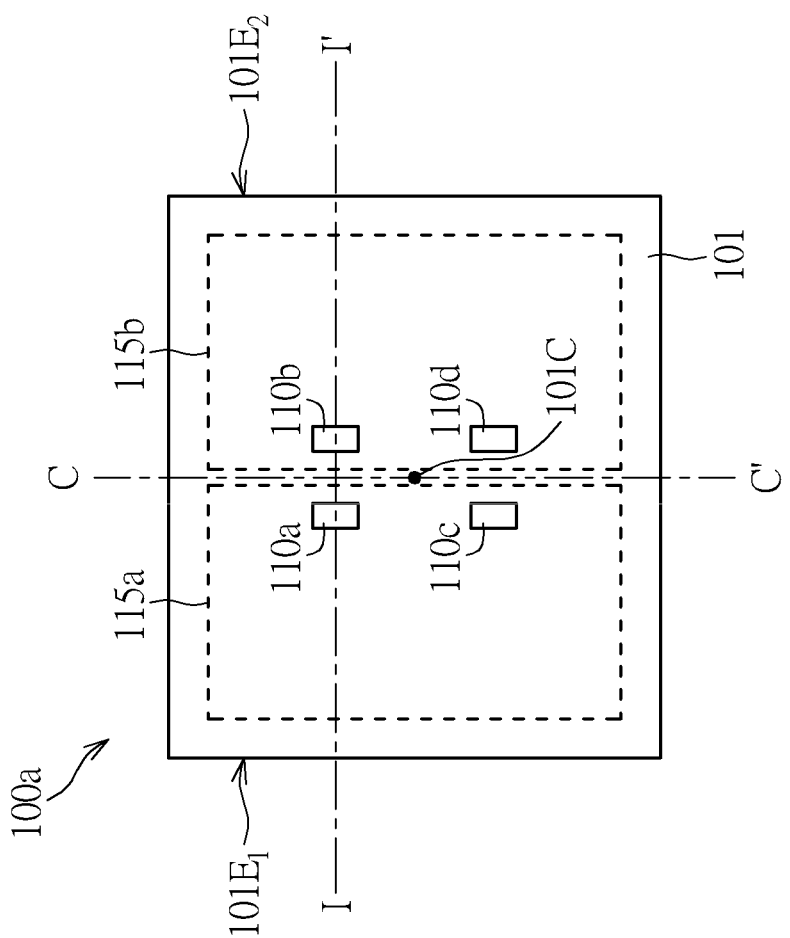
FIG. 2 is a plan view of an arrangement of holes in a substrate of the semiconductor package structure shown in FIG. 1.

FIG. 1 is a cross-sectional view of a semiconductor package structure 100a according to one embodiment of the disclosure. FIG. 2 is a plan view of an arrangement of holes in a substrate 101 of the semiconductor package structure 100a shown in FIG. 1, and FIG. 1 is a cross-sectional view of the semiconductor package structure 100a along line I-I' of FIG. 2.

Additional features can be added to the semiconductor package structure 100a. Some of the features described below can be replaced or eliminated for different embodiments. To simplify the diagram, only a portion of the semiconductor package structure 100a is depicted in FIGS. 1 and 2. In some embodiments, the semiconductor package structure 100a may include a wafer-level semiconductor package, for example, a flip-chip semiconductor package.

Referring to FIG. 1, the semiconductor package structure 100a may be mounted on a base (not shown). In some embodiments, the semiconductor package structure 100a may be a system-on-chip (SOC) package structure. Moreover, the base may include a printed circuit board (PCB) and may be formed of polypropylene (PP). In some embodiments, the base may include a package substrate. The semiconductor package structure 100a may be mounted on the base by a bonding process. For example, the semiconductor package structure 100a may include bump structures 111. In some embodiments, the bump structures 111 may be conductive ball structures (such as ball grid array (BGA)), conductive pillar structures, or conductive paste structures that are mounted on and electrically coupled to the base by the bonding process.

According to one embodiment, the semiconductor package structure 100a may include a substrate 101. The substrate 101 has a wiring structure therein. In some embodiments, the wiring structure in the substrate 101 may be a fan-out structure, and may include one or more conductive pads 103, conductive vias 105, conductive layers 107 and conductive pillars 109. In such cases, the wiring structure in the substrate 101 may be disposed in one or more inter-metal dielectric (IMD) layers. In some embodiments, the IMD layers may be formed of organic materials, which include a polymer base material, non-organic materials, which include silicon nitride ($SiN_x$), silicon oxide ($SiO_x$), grapheme, or the like. For example, the IMD layers are made of a polymer base material. It should be noted that the number and configuration of the IMD layers, the conductive pads 103, the conductive vias 105, the conductive layers 107 and the conductive pillars 109 shown in the figures and only some examples and are not limitations to the present invention.

Moreover, the semiconductor package structure 100a further comprises a first semiconductor die 115a and a second semiconductor die 115b bonded onto the substrate 101 through a plurality of conductive structures 119. The substrate 101 has a first surface 101a and a second surface 101b opposite thereto, the first surface 101a is facing the first semiconductor die 115a and the second semiconductor die 115b, and the second surface 101b is facing the above-mentioned base. The conductive structures 119 are disposed over the first surface 101a and below the first semiconductor die 115a and the second semiconductor die 115b, and the bump structures 111 are disposed on the second surface 101b of the substrate 101.

In some embodiments, the first semiconductor die 115a and the second semiconductor die 115b are electrically coupled to the bump structures 111 through the conductive structures 119 and the wiring structure in the substrate 101. In addition, the conductive structures 119 may be controlled collapse chip connection (C4) structures. It should be noted that the number of semiconductor dies integrated in the semiconductor package structure 100a is not limited to that disclosed in the embodiment.

In some embodiments, the first semiconductor die 115a and the second semiconductor die 115b are active devices. For example, the first semiconductor die 115a and the second semiconductor die 115b may be logic dies including a central processing unit (CPU), a graphics processing unit (GPU), a dynamic random access memory (DRAM) controller, or any combinations thereof. In some other embodiments, one or more passive devices are also bonded onto the substrate 101.

The first semiconductor die 115a and the second semiconductor dies 115b are arranged side-by-side. In some embodiments, the first semiconductor die 115a and the second semiconductor dies 115b are separated by a molding material 117. The molding material 117 surrounds the first semiconductor die 115a and the second semiconductor die 115b, and adjoins the sidewalls of the first semiconductor die 115a and the second semiconductor die 115b. In some embodiments, the molding material 117 includes a nonconductive material such as an epoxy, a resin, a moldable polymer, or another suitable molding material. In some embodiments, the molding material 117 is applied as a substantial liquid, and then is cured through a chemical reaction. In some other embodiments, the molding material 117 is an ultraviolet (UV) or thermally cured polymer applied as a gel or malleable solid, and then is cured through a UV or thermal curing process. The molding material 117 may be cured with a mold (not shown).

In some embodiments, the surfaces of the first semiconductor die 115a and the second semiconductor dies 115b facing away from the first surface 101a of the substrate 101 are exposed by the molding material 117, such that a heat dissipating device (not shown) can directly attached to the surfaces of the first semiconductor die 115a and the second semiconductor dies 115b. As a result, the heat-dissipation efficiency of the semiconductor package structure 100a can be improved, particularly for a large semiconductor package structure, such as 50 mm×50 mm, which is preferred for high power applications.

The semiconductor package structure 100a may further include a polymer material 121 disposed under the molding material 117, the first semiconductor die 115a and the second semiconductor die 115b, and between the conductive structures 119. The semiconductor package structure 100a may further include an underfill layer 123 interposed between the first surface 101a of the substrate 101 and the polymer material 121. In some embodiments, the first semiconductor die 115a, the second semiconductor dies 115b and the molding material 117 are surrounded by the underfill layer 123. The polymer material 121 and the underfill layer 123 are disposed to compensate for differing coefficients of thermal expansion (CTEs) between the substrate 101, the conductive structures 119, the first semiconductor die 115a and the second semiconductor dies 115b.

In addition, the semiconductor package structure 100a includes a frame 113 attached to the first surface 101a of the substrate 101 through an adhesive layer 112. The first semiconductor die 115a and the second semiconductor die 115b are surrounded by the frame 113 and the adhesive layer 112. In some embodiments, the frame 113 and the adhesive layer 112 are separated from the underfill layer 121 by a gap 124. The substrate 101 has a first edge $101E_1$ and a second edge $101E_2$ opposite thereto. In some embodiments, the first edge $101E_1$ and the second edge $101E_2$ may be coplanar with sidewalls of the frame 113 and the adhesive layer 112.

Still referring to FIG. 1, the substrate 101 of the semiconductor package structure 100a includes a first hole 110a and a second hole 110b formed on the second surface 101b. In some embodiments, at least one of the first hole 110a and the second hole 110b penetrates through the substrate 101 from the first surface 101a to the second surface 101b. Although the first hole 110a and the second hole 110b shown in FIG. 1 penetrate through the substrate 101, in some other embodiments, both the first hole 110a and the second hole 110b do not penetrate through the substrate 101 from the first surface 101a to the second surface 101b. In some embodiments, the first hole 110a is covered by the first semiconductor die 115a, and the second hole 110b is covered by the second semiconductor die 115b. In other words, the first hole 110a is located within the projection of the first semiconductor die 115a on the substrate 101, and the second hole 110b is located within the projection of the second semiconductor die 115b on the substrate 101.

Specifically, the first semiconductor die 115a and the second semiconductor die 115b have a center line C-C' between them. The first hole 110a is disposed closer to the center line C-C' than the first edge $101E_1$ of the substrate 101, and the second hole 110b is disposed closer to the center line C-C' than the second edge $101E_2$ of the substrate 101. Although there are only two holes in the substrate 101 shown in FIG. 1, it should be noted that there is no limitation on the number of the holes formed in the substrate 101.

In some embodiments, the first hole 110a and the second hole 110b may be formed by a laser drilling process or another suitable process. It should be noted that the first hole 110a and the second hole 110b may be formed by the same forming process for the conductive pillars 109 in the wiring structure of the substrate 101. Moreover, the first semiconductor die 115a and the second semiconductor die 115b are bonded to the substrate 101 after forming the holes in the substrate 101. Therefore, the damage of the first semiconductor die 115a and the second semiconductor die 115b can be prevented.

Referring to FIG. 2, which is a plan view of an arrangement of holes in a substrate 101 of the semiconductor package structure 100a shown in FIG. 1, and FIG. 1 is a cross-sectional view of the semiconductor package structure 100a along line I-I' of FIG. 2. It should be noted that FIG. 2 is the plan view from the bottom of the semiconductor package structure 100a. In other words, FIG. 2 is the plan view from the second surface 101b of the substrate 101, which the bump structures 111 are disposed on. In particular, the bump structures 111 are omitted for brevity.

As shown in FIG. 2, the substrate 101 may include more than two holes. In particular, the substrate 101 may further include a third hole 110c and the fourth hole 110d formed on the second surface 101b. The third hole 110c is covered by the first semiconductor die 115a, and the fourth hole 110d is covered by the second semiconductor die 115b. It should be noted that the substrate 101 has a center 101C, and the first hole 101a, the second hole 101b, the third hole 110c, and the fourth hole 110d are disposed closer to the center 101C than the first edge $101E_1$ and the second edge $101E_2$ of the substrate 101.

The holes formed in the substrate 101, for example, the first hole 110a, the second hole 110b, the third hole 110c and the fourth hole 110d, are designed to release the stress in the substrate 101, especially the stress concentrated in the region below the interface between two semiconductor dies (i.e. the first semiconductor die 115a and the second semiconductor die 115b). Since the semiconductor package structure 100a may be highly stressed due to the different coefficients of thermal expansion (CTEs) of the substrate 101 and the semiconductor dies, the holes formed in the substrate 101 can solve the warping or cracking problems caused by mismatched CTEs. As a result, the electrical connection within the semiconductor package structure 100a may not be damaged, and the reliability of the semiconductor package structure 100a may be increased.

Figure 3:
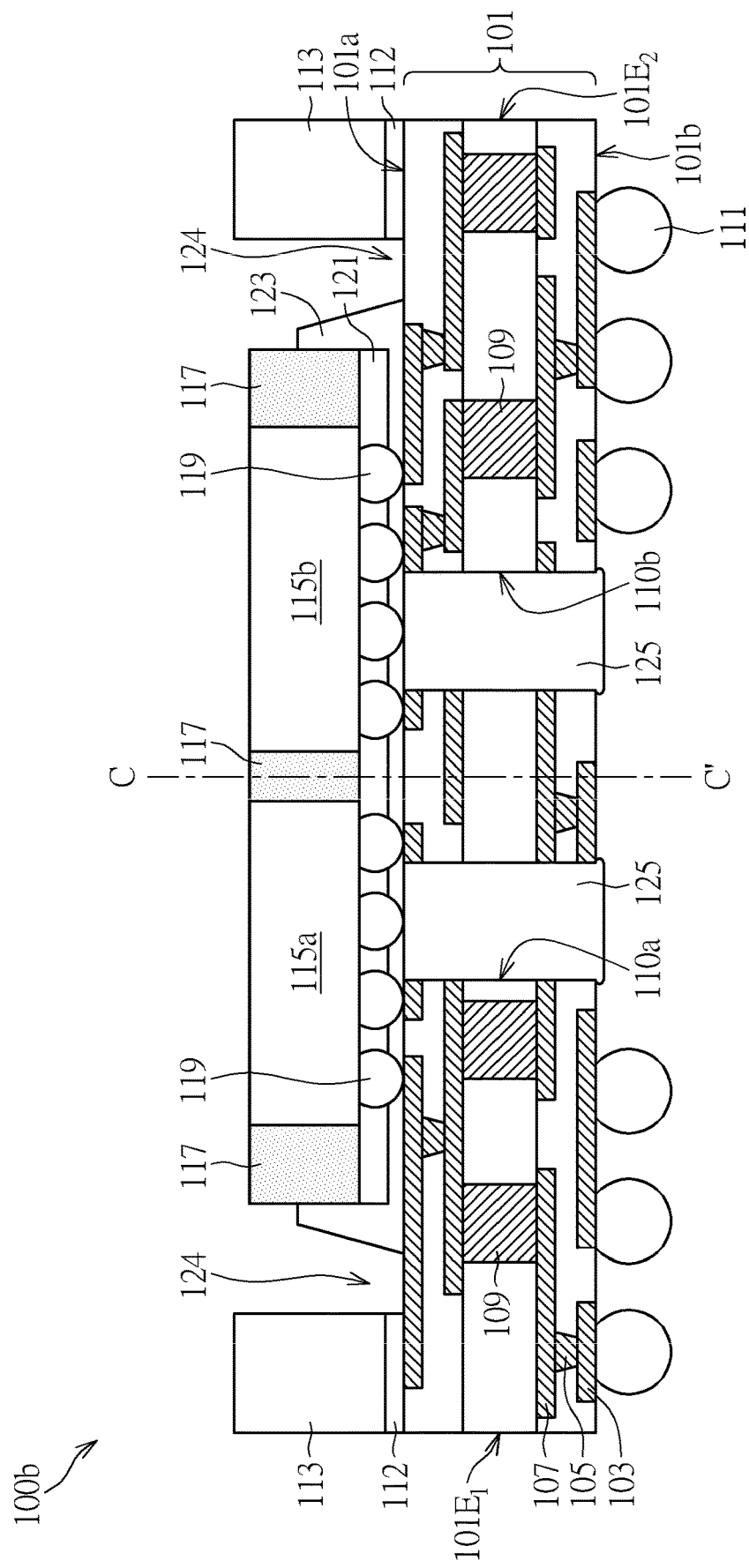
FIG. 3 is a cross-sectional view of a semiconductor package structure according to another embodiment of the disclosure.

FIG. 3 is a cross-sectional view of a semiconductor package structure 100b according to another embodiment of the disclosure. Descriptions of elements of the embodiments hereinafter that are the same as or similar to those previously described with reference to FIG. 1 are omitted for brevity.

As shown in FIG. 3, the semiconductor package structure 100b includes a stress buffer layer 125 filled in the first hole 110a and the second hole 110b. The stress buffer layer 125 is made of a polymer material, such as a silicone resin or rubber. In some embodiments, the stress buffer layer 125 is made of an organic resin, such as Ajinomoto Build-up Film (ABF).

Moreover, the stress buffer layer 125 may be formed by a spin coating process. In some other embodiments, a material of the stress buffer layer 125 may be dispensed in the first hole 110a and the second hole 110b, and an excess portion of the material of the stress buffer layer 125 may be removed. In some embodiments, the stress buffer layer 125 may be formed before bonding the first semiconductor die 115a and the second semiconductor die 115b to the substrate 101.

In some embodiments, the stress buffer layer 125 may filled up the first hole 110a and the second hole 110b, and the surfaces of the stress buffer layer 125 are level with the second surface 101b of the substrate 101. In some other embodiments, the surfaces of the stress buffer layer 125 may not be level with the second surface 101b of the substrate 101 according to the actual manufacturing processes.

Filling the first hole 110a and the second hole 110b with the stress buffer layer 125 may offer advantages like preventing the impurities and dusts from dropping into the first hole 110a and the second hole 110b during the handling process of the substrate 101. In addition, the warping or cracking problems caused by mismatched coefficients of thermal expansion in the semiconductor package structure 100b can be solved by the holes (including the first hole 110a and the second hole 110b) and the stress buffer layer 125 formed in the substrate 101. Accordingly, the electrical connection within the semiconductor package structure 100b may not be damaged, and the lifespan of the semiconductor package structure 100b may be increased.

Figure 4:
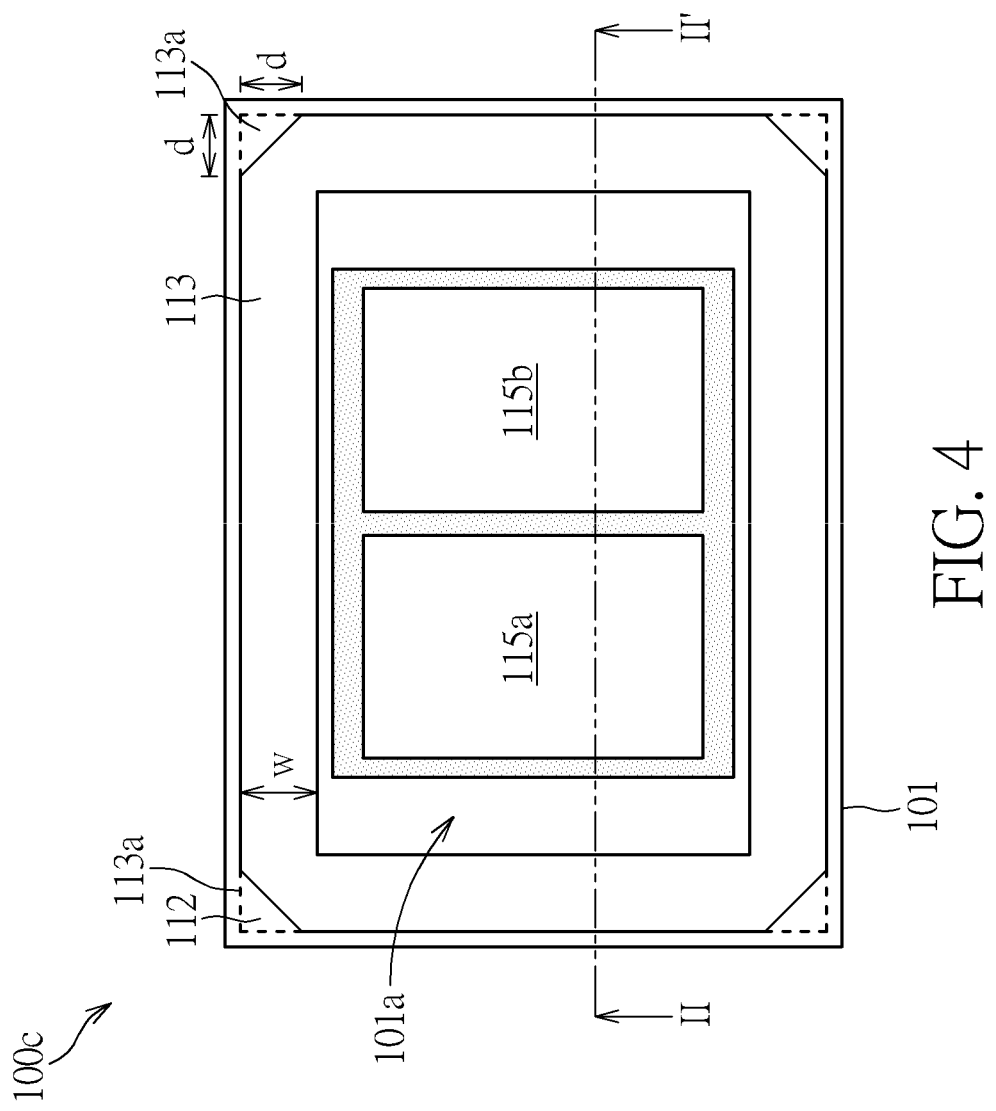
FIG. 4 is a schematic plan view of a semiconductor package structure according to still another embodiment of the disclosure.
Figure 5:
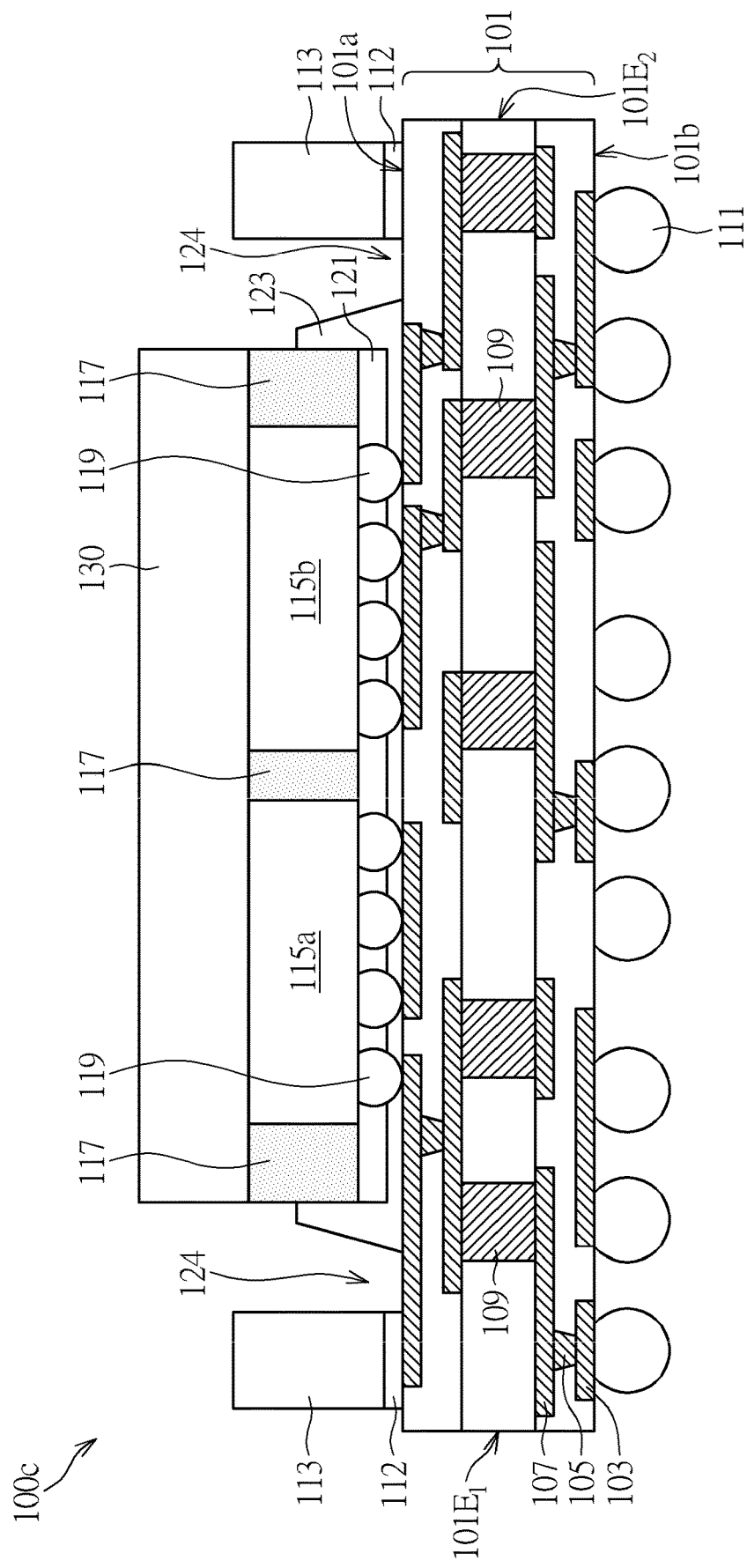
FIG. 5 is a schematic, cross-sectional diagram taken along line II-IF in FIG. 4.

Please refer to FIG. 4 and FIG. 5. FIG. 4 is a schematic plan view of a semiconductor package structure 100c according to still another embodiment of the disclosure. FIG. 5 is a schematic, cross-sectional diagram taken along line II-IF in FIG. 4. Like layers, regions or elements are designated by like numeral numbers.

As shown in FIG. 4 and FIG. 5, likewise, the semiconductor package structure 100c comprises a first semiconductor die 115a and a second semiconductor die 115b mounted on the substrate 101 through a plurality of conductive structures 119. The substrate 101 has a first surface 101a and a second surface 101b opposite thereto, the first surface 101a is facing the first semiconductor die 115a and the second semiconductor die 115b, and the second surface 101b is facing the above-mentioned base such as a PCB or a system board. The conductive structures 119 are disposed over the first surface 101a and below the first semiconductor die 115a and the second semiconductor die 115b, and the bump structures 111 are disposed on the second surface 101b of the substrate 101. The bump structures 111 may be a ball grid array (BGA) or a land grid array (LGA). According to one embodiment, a heat sink 130 may be mounted on the first semiconductor die 115a and the second semiconductor die 115b for heat dissipation.

According to one embodiment, the semiconductor package structure 100c comprises a continuous, annular frame 113 mounted on the first surface 101a of the substrate 101. According to one embodiment, the frame 113 may have a substantially rectangular shape when viewed from the above. According to one embodiment, the frame 113 may be made of metal or metal alloys. For example, the frame 113 may be made of copper, but is not limited thereto. The frame 113 may be attached to the first surface 101a of the substrate 101 through the adhesive layer 112. According to the embodiment, the frame 113 has four bevel angles at its four corners, instead of the four right-angle corners as depicted in FIG. 2. Portions of the frame within the retracted regions 113a, which are indicated by dashed lines, may be truncated from the frame 113 by any suitable cutting means to form the bevel angles at the four corners of the frame 113.

In a case that the bump structures 111 are LGA arrangement, a securing means such as a socket (not shown) may be provided on the frame 113 to secure the substrate 101 to the aforesaid base such as a PCB or a system board. The socket may exert undesired mechanical stress onto the frame 113 and the substrate 101 and may cause damage or defects such as fractures in the substrate 101. To alleviate such stress caused by the socket, a frame 113 with a wider width w is desired. However, the frame with a wider width makes the warpage problem worse. The present disclosure solves the warpage problem by truncating the corners of the frame 113, thereby eliminating or reducing the warpage when a frame with wider width is used.

Figure 6:
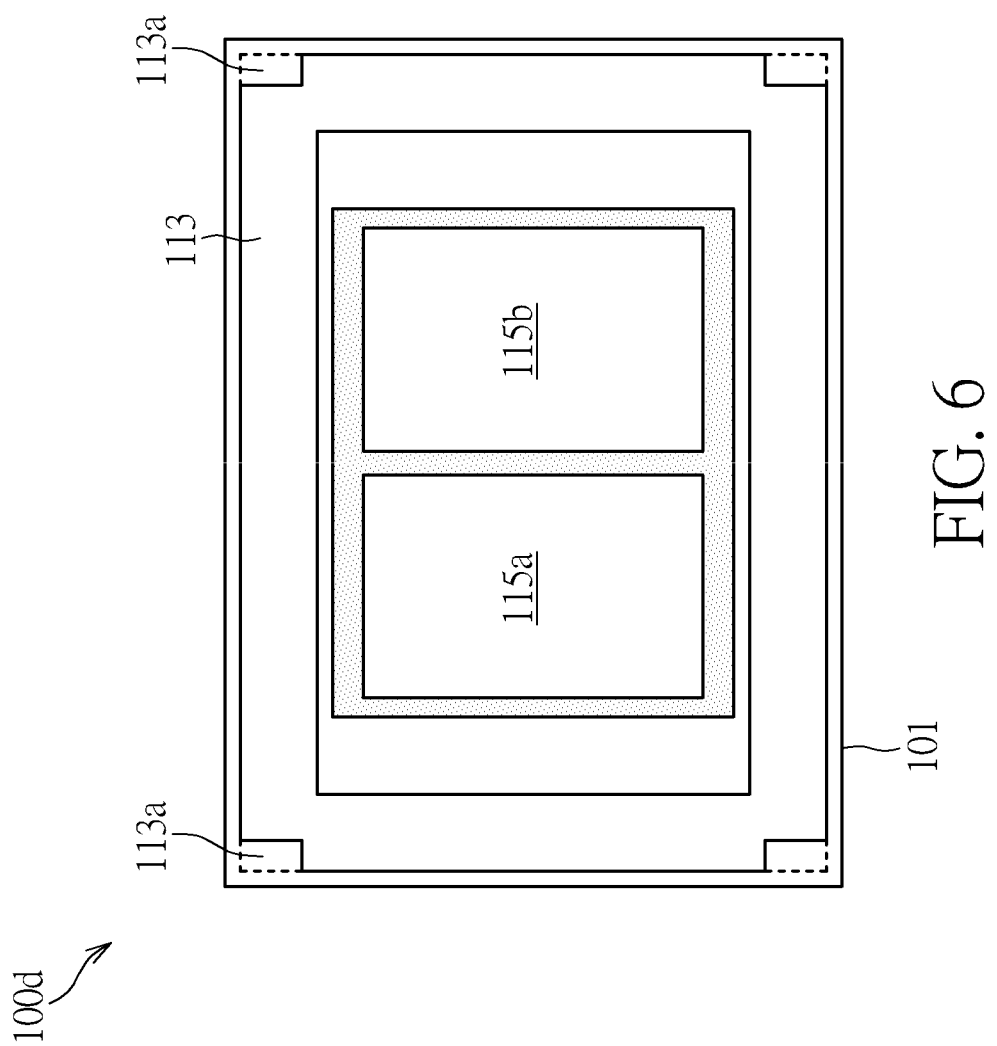
FIG. 6 is a schematic plan view of a semiconductor package structure according to still another embodiment of the disclosure.

According to one embodiment, each of the retracted regions 113a may be of a right-triangle shape, but is not limited thereto. According to some embodiments, for example, each of the retracted regions 113a may be of a rectangular shape, as the semiconductor package structure 100d depicted in FIG. 6. It is understood that the shapes of the truncated edge at the four corners of the frame 113 in FIG. 4 and FIG. 6 are for illustration purposes only. In some embodiments, the shapes of the truncated edge may comprise arc shapes, curved shapes or irregular shapes. The cut shape at the four corners of the frame 113 may depend upon design requirements in order to obtain improvement on package warpage, stress distribution and cost. According to one embodiment, the adhesive layer 112 within the retracted regions 113a may be exposed after the truncated frame 113 is mounted on the first surface 101a of the substrate 101.

According to one embodiment, the frame 113 has a width w, which may range between 1 mm and 18 mm, for example, 12 mm. According to one embodiment, the width w of the frame 113 may be greater than or equal to 1 mm. According to one embodiment, the area of each of the right-triangle shaped retracted regions 113a is presented by $d^2/2$, wherein d is the length of the sides or legs of the right-triangle shaped retracted regions 113a. According to one embodiment, the length d is greater than or equal to w/2. By providing such right-triangle shaped retracted regions 113a in the frame 113 and/or the adhesive layer 112, the warpage control of the semiconductor package structure 100c can be significantly improved.

Figure 7:
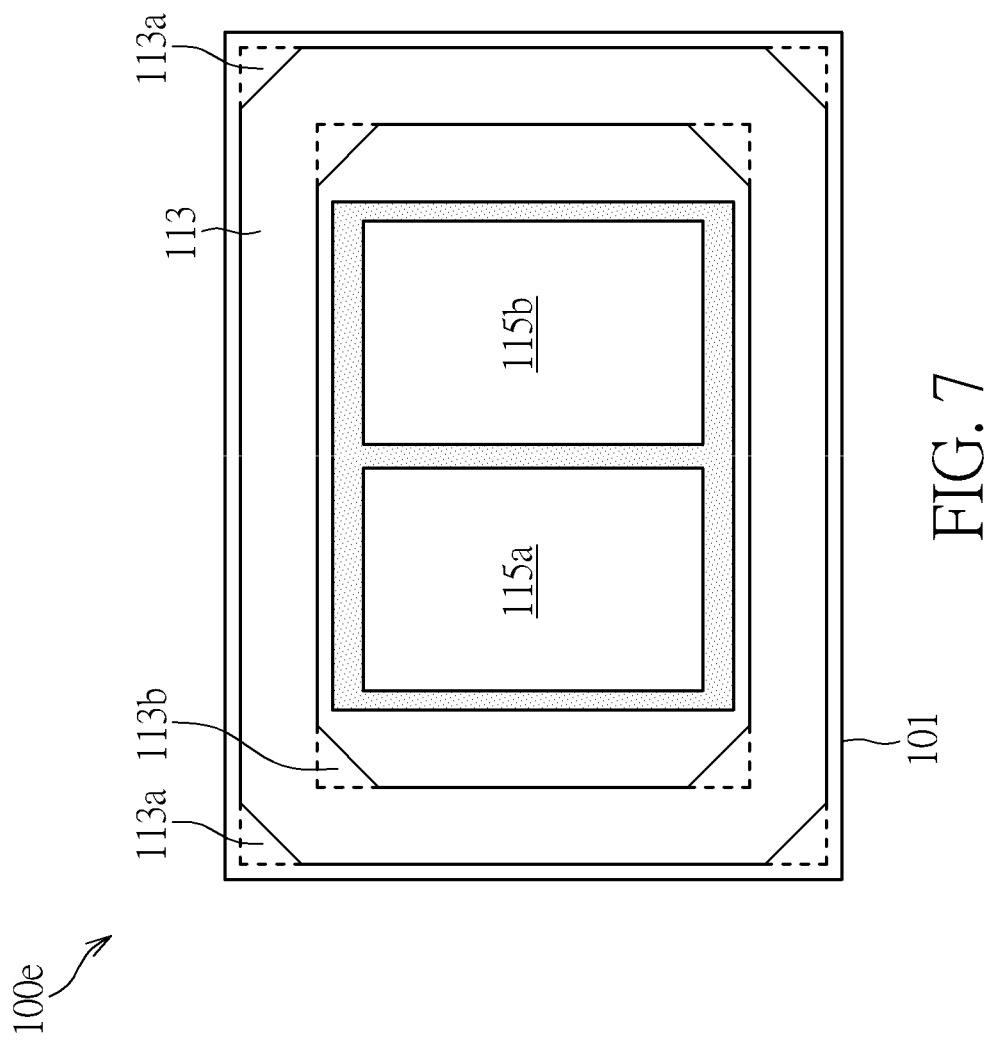
FIG. 7 is a schematic plan view of a semiconductor package structure according to yet another embodiment of the disclosure.

FIG. 7 is a schematic plan view of a semiconductor package structure 100e according to yet another embodiment of the disclosure. As shown in FIG. 7, the difference between the semiconductor package structure 100e in FIG. 7 and the semiconductor package structure 100c in FIG. 4 is that the frame 113 of the semiconductor package structure 100e in FIG. 7 comprises an extension portion 113b that inwardly extends at the inner corners of the frame 113. Therefore, the inner corners of the frame 113 comprise no right angle. By providing such configuration, the removed right-triangle shaped retracted regions 113a at the outer corners of the frame 113 may be compensated by adding the extension portions 113b at the inner corners of the frame 113, which are indicated by dashed lines. It is beneficial to do so because the overall surface of the frame 113 for mounting the socket may be maintained and the stress exerted by the socket or the securing means of the socket may be more evenly distributed across the frame 113.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor package structure, comprising:
a substrate having a first surface and second surface opposite thereto, wherein the substrate comprises a wiring structure;
a first semiconductor die disposed on the first surface of the substrate and electrically coupled to the wiring structure;
a second semiconductor die disposed on the first surface and electrically coupled to the wiring structure, wherein the first semiconductor die and the second semiconductor die are arranged in a side-by-side manner;
a molding material surrounding the first semiconductor die and the second semiconductor die, wherein the first semiconductor die is separated from the second semiconductor die by the molding material; and
an annular frame mounted on the first surface of the substrate, wherein the annular frame surrounds the first semiconductor die and the second semiconductor die.

2. The semiconductor package structure according to claim 1, wherein the annular frame has a substantially rectangular shape when viewed from above.

3. The semiconductor package structure according to claim 1, wherein the annular frame comprises a retracted region at an outer corner of the annular frame.

4. The semiconductor package structure according to claim 3, wherein a portion of the frame within the retracted region is truncated from the annular frame, thereby forming a bevel angle at the outer corner of the annular frame.

5. The semiconductor package structure according to claim 1 further comprising bump structures disposed on the second surface of the substrate.

6. The semiconductor package structure according to claim 5, wherein the bump structures are a land grid array (LGA).

7. The semiconductor package structure according to claim 6, wherein a securing means is provided on the annular frame to secure the substrate to a base.

8. The semiconductor package structure according to claim 7, wherein the base comprises a PCB or a system board.

9. The semiconductor package structure according to claim 7, wherein the securing means comprises a socket.

10. The semiconductor package structure according to claim 1 further comprising an adhesive layer between the annular frame and the first surface of the substrate.

11. The semiconductor package structure according to claim 10, wherein, the annular frame comprises a retracted region and the adhesive layer is not covered by the annular frame within the retracted region.

12. The semiconductor package structure according to claim 1, wherein the annular frame has a width, and wherein the width of the annular frame is greater than or equal to 1 mm.

13. The semiconductor package structure according to claim 1, wherein the annular frame has a width, and wherein a range of the width of the annular frame is between 1 mm and 18 mm.

14. The semiconductor package structure according to claim 13, wherein the annular frame comprises a retracted region and a shape of the retracted region is a right-triangle.

15. The semiconductor package structure according to claim 14, wherein an area of the right-triangle is presented by $d2/2$, wherein d is the length of the sides of legs of the right-triangle, and wherein d is greater than or equal to $w/2$, wherein w is the width of the annular frame.

16. The semiconductor package structure according to claim 1 further comprising an extension portion that inwardly extends at an inner corner of the annular frame.

17. The semiconductor package structure according to claim 1, wherein the annular frame comprises at least one bevel angle at an outer corner of the annular frame.

18. The semiconductor package structure according to claim 1, wherein the annular frame comprises a retracted region at an outer corner of the annular frame, and the annular frame has a substantially rectangular shape when viewed from above.

* * * * *